United States Patent
Bunyan et al.

(10) Patent No.: US 8,633,402 B2
(45) Date of Patent: Jan. 21, 2014

(54) LOW FORCE DEFLECTION AND CORROSION RESISTANT EMI GASKET

(75) Inventors: Michael H. Bunyan, Chelmsford, MA (US); George R. Watchko, Stoneham, MA (US); William G. Lionetta, Harwich Port, MA (US)

(73) Assignee: Parker Hannifin Corporation, Cleveland, OH (US)

( * ) Notice: Subject to any disclaimer, the term of this patent is extended or adjusted under 35 U.S.C. 154(b) by 0 days.

(21) Appl. No.: 13/643,331

(22) PCT Filed: May 10, 2011

(86) PCT No.: PCT/US2011/035920
§ 371 (c)(1),
(2), (4) Date: Nov. 20, 2012

(87) PCT Pub. No.: WO2011/143216
PCT Pub. Date: Nov. 17, 2011

(65) Prior Publication Data
US 2013/0068519 A1    Mar. 21, 2013

Related U.S. Application Data

(60) Provisional application No. 61/333,792, filed on May 12, 2010.

(51) Int. Cl.
*H05K 9/00* (2006.01)
(52) U.S. Cl.
USPC ............ 174/358; 277/649; 277/652; 277/920
(58) Field of Classification Search
USPC ............................ 174/358; 277/649, 652, 920
See application file for complete search history.

(56) References Cited

U.S. PATENT DOCUMENTS

| | | | |
|---|---|---|---|
| 2,477,267 A | 7/1949 | Robinson | |
| 3,140,342 A | 7/1964 | Ehrreich et al. | |
| 4,449,774 A | 5/1984 | Takashi et al. | |
| 4,662,967 A | 5/1987 | Bogan et al. | |
| 4,900,877 A | 2/1990 | Dubrow et al. | |
| 5,107,071 A * | 4/1992 | Nakagawa | 174/358 |
| 5,607,167 A * | 3/1997 | Franckx | 277/612 |
| 6,173,970 B1 | 1/2001 | Choudary et al. | |
| 6,231,055 B1 | 5/2001 | Dams et al. | |
| 6,497,414 B1 | 12/2002 | Roosen | |
| 6,613,976 B1 * | 9/2003 | Benn, Jr. | 174/358 |
| 6,717,052 B2 * | 4/2004 | Wang et al. | 174/381 |
| 6,818,822 B1 * | 11/2004 | Gilliland et al. | 174/357 |
| 8,203,083 B2 * | 6/2012 | Song | 174/354 |
| 2001/0038180 A1 | 11/2001 | Gaines et al. | |
| 2003/0113531 A1 | 6/2003 | Hajmrle et al. | |

OTHER PUBLICATIONS

PCT/US2011/035920 International Search Report dated Aug. 9, 2011.

* cited by examiner

*Primary Examiner* — Hung Ngo
(74) *Attorney, Agent, or Firm* — Novak Druce Connolly Bove & Quigg LLP

(57) ABSTRACT

An EMI shielding gasket having enhanced corrosion protection and force deflection is provided. The gasket has a body formed from an electrically conductive material with outwardly extending projections from one or both surface portions thereof. A non-conductive polymer gel is applied to the spaces between the projections for protection against corrosion. The gasket is particularly adapted for use in external aluminum aircraft surfaces which are exposed to harsh environmental conditions.

10 Claims, 3 Drawing Sheets

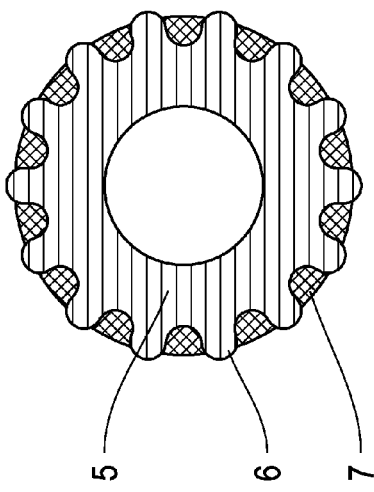
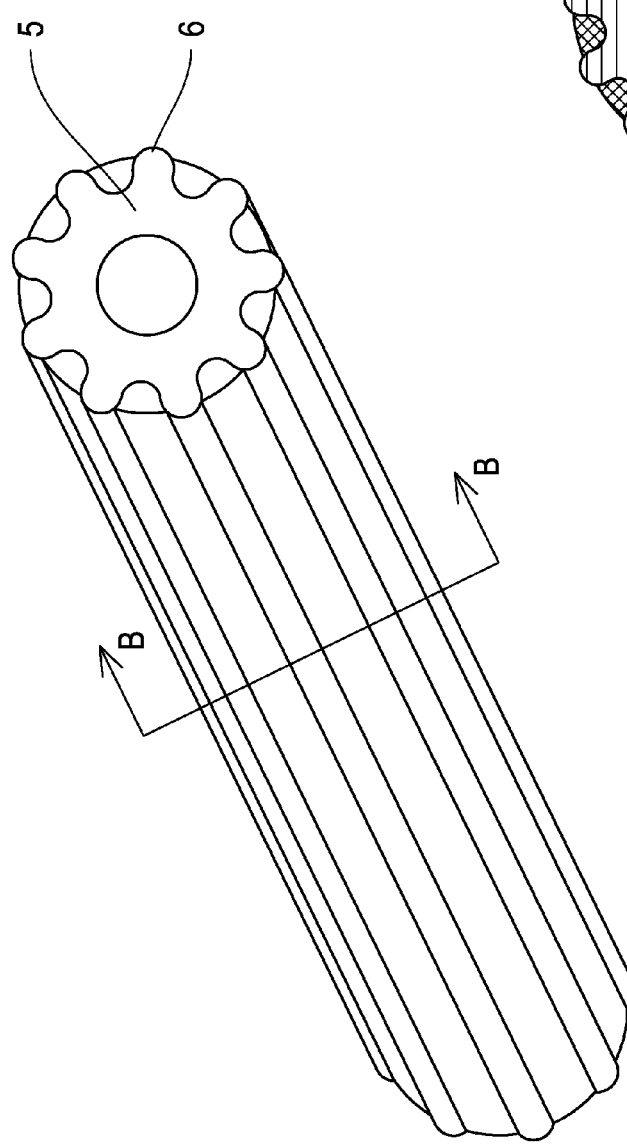

LOW FORCE DEFLECTION AND CORROSION RESISTANT EMI GASKET

CROSS-REFERENCE TO RELATED APPLICATIONS

This application is a national phase application of PCT/US2011/035920, filed May 10, 2011, which claims the benefit of priority of U.S. Provisional Application No. 61/333,792, filed on May 12, 2010, the disclosures of which are incorporated herein by reference in their entirety.

BACKGROUND OF THE INVENTION

The present invention relates to improved gaskets used for shielding electronic devices from electromagnetic interference or radio frequency interference (EMI or RFI), and for environmental sealing. Such improvements include enhanced resistance to corrosion and a reduction in the compressive forces needed to create and maintain the seal.

The operation of electronic equipment, such as televisions, radios, computers, medical instruments, business machines, communication equipment, and the like, is typically accompanied by the generation of radio frequency and/or electromagnetic radiation within the electronic circuits of the electronic system. The increase in operating frequencies in commercial devices utilizing electronic enclosures, such as doors and access panels, housings for shielding computer cabinets and drives, cathode ray tubes (CRTs) and automotive electronic modules, results in an elevated level of high frequency electromagnetic interference (EMI). Any gap between the metal surfaces confronting or mating with the doors and access panels affords an opportunity for the passage of electromagnetic radiation and the creation of electromagnetic interference. These gaps also interfere with the electric currents running along the surfaces of the cabinets from EMI energy, which is absorbed and conducted to the ground.

If not properly shielded, RFI and EMI radiation can cause considerable interference with unrelated electronic equipment. Accordingly, it is necessary to effectively shield and ground all sources of radio frequency and electromagnetic radiation within the electronic system. Therefore, it is advisable to use a conducting shield or gasket between such surfaces to block the electromagnetic interference.

To attenuate EMI effects, shielding gaskets having the capability of absorbing and/or reflecting EMI energy may be employed both to confine the EMI energy within a source device, and to insulate that device or other "target" devices from other source devices. Such shielding is provided as a barrier inserted between the source and the other devices, and is typically configured as an electrically conductive and grounded housing which encloses the device. As the circuitry of the device generally must remain accessible for servicing or the like, most housings are provided with removable accesses such as doors, hatches, panels, or covers. Between even the flattest of these accesses and its corresponding mating or faying surface, however, gaps may be present which reduce the efficiency of the shielding by containing openings through which radiant energy may leak or otherwise pass into or out of the device. Moreover, such gaps represent discontinuities in the surface and ground conductivity of the housing or other shielding, and may even generate a secondary source of EMI radiation by functioning as a form of slot antenna. In this regard, bulk or surface currents induced within the housing develop voltage gradients across any interface gaps in the shielding, which gaps thereby function as antennas which radiate EMI noise. In general, the amplitude of the noise is proportional to the gap length, with the width of the gap having a less appreciable effect.

For filling gaps within mating surfaces of housings and other EMI shielding structures, gaskets and other seals have been proposed both for maintaining electrical continuity across the structure, and for excluding from the interior of the device such contaminates as moisture and dust. Such seals can be bonded or mechanically attached to, or press-fit into, one of the mating surfaces, and function to close any interface gaps to establish a continuous conductive path there across by conforming under an applied pressure to irregularities between the surfaces. Accordingly, seals intended for EMI shielding applications are specified to be of a construction which not only provides electrical surface conductivity even while under compression, but which also has a resiliency allowing the seals to conform to the size of the gap. The seals additionally should be wear resistant, economical to manufacture, and capable of withstanding repeated compression and relaxation cycles.

Materials employed to fabricated EMI gaskets commonly include, for instance, various polymers containing electrically conductive metal particles, such as particles of copper, nickel, silver, aluminum, tin, or various conductive alloys of these metals. Other conductive particles and fibers such as carbon, graphite, or conductive polymeric materials may be substituted for the metal particles. Alternatively, EMI gaskets can be formed from wires encapsulated in resilient polymeric materials, such as elastomers or foam rubber.

The above-described gaskets exhibit a number of problems in actual use, such as corrosion of the metallic wire portion of the gasket, and the failure of the elastomer to provide the desired environmental seal. The use of noble metal wires adds significantly to the cost of the gasket and does not always solve the corrosion and oxidation problems. Additionally, a moisture leak path may be formed at the point where the wires contact the sealing metal surfaces if the elastomer does not adequately seal around and between the wires or metallic surfaces to prevent the migration of moisture into or through the gasket area. This may result in corrosion or other problems in the electrical or electronic device being protected by the gasket. These problems are exacerbated in high performance applications, such as aircraft applications, where the seal is required to perform in difficult environments.

Accordingly, it is frequently the case that gaskets providing satisfactory EMI shielding capabilities are unable to provide environmental sealing, thereby causing corrosion problems. Alternatively, gaskets which provide adequate environmental sealing frequently fail to provide the desired EMI shielding capabilities. As a result, the EMI shielding and environmental sealing functions have typically been seen as two separate functions requiring two separate products. For instance, a gasket designed for environmental sealing can include an external conventional environmental seal, such as an elastomeric or rubber O-ring, coupled with an interior EMI gasket, such as a wire mesh. This arrangement is undesirable because it is bulky, requires extra design, engineering and machining, increasing installation difficulties and adding to the cost and risks of proper installation.

Representative gaskets and seals developed by others are described below by way of illustration and comparison.

U.S. Pat. No. 2,477,267 discloses EMI shielding gaskets for placement between adjacent metallic surfaces. The gaskets are wire meshes or screens impregnated with a suitable elastomer as an environmental shield to create a non-porous structure. Electrical contact between the adjacent metallic surfaces is provided by contact with the high points of the mesh which are exposed through the elastomer coating.

U.S. Pat. No. 4,900,877 is also directed to EMI gaskets formed from wires or metal filaments which utilize a gel material to seal the space between adjacent metallic surfaces. The wire mesh is encapsulated in the polymeric gel to provide an environmental seal and to reduce corrosion.

U.S. Pat. No. 3,140,342 describes metal-filled conductive plastic sheets which are used as EMI shielding gaskets. The gaskets of the reference are composite structures having a compressible non-conductive plastic core which reinforces the conductive layer to provided additional resiliency for the gasket.

U.S. Pat. No. 6,173,970 is directed to composite gaskets comprising a non-conductive silicone sponge for environmental protection, and a metal-filled conductive silicone gasket for EMI shielding. The conductive composite gasket of the reference is adapted for placement between adjacent electronic parts having a tongue and groove configuration.

U.S. Pat. No. 6,231,055 describes another composite strip gasket design comprising a block of gel sealant and an interlocking carrier member. The gasket is adapted to be inserted and locked in place in a cavity formed in an electronic device to provide shielding for the device.

U.S. Pat. Nos. 6,454,276 and 6,719,293 are directed to composite, multi-layered gaskets for use in aircraft to provide corrosion resistance and EMI shielding for external aircraft electronics. The gasket design includes sheets of conductive wire mesh encapsulated with a fluorosilicone compound that provides enhanced corrosion resistance in such external applications.

U.S. Pat. No. 6,497,414 discloses a sealing element design with radially projecting ribs for supporting and protecting fiber optic cables. The sealing element can include sections formed from a gel material for environmental protection.

The respective disclosures of each of the patents listed above are incorporated by reference herein in their entireties.

It is accordingly an objective of the present invention to provide an improved environmental seal having a high level of EMI shielding as well as resistance to environmental corrosion and degradation for use in difficult sealing environments.

SUMMARY OF THE INVENTION

The objective of the invention is achieved with a gasket having a body formed from an electrically conductive elastomeric polymer having a plurality of projections extending outwardly from a surface of the body, the projections being spaced apart from each other forming a textured surface. An electrically nonconductive gel coating can be applied to the space between the projections to fill the spaces. The use of the gel coating in this manner provides an environmental seal against corrosion while the textured surface of the gasket reduces the compressive forces required to form a seal between mating surfaces.

In one embodiment, the gaskets of the invention are formed into various shapes to facilitate the placement of the gaskets between adjacent mating surfaces. The gaskets can be generally planar, and as such formed into sheets, tubular or cylindrical, or elongated and extending lengthwise along a longitudinal axis of the gasket. The projections can be in the shape of miniature castellations or pedestal like structures, pillars, ribs, embossments or columns extending upwardly from the surface of the planar or tubular gasket surface. These projections can be positioned on one side or both opposed surfaces of the gasket.

The gasket of the invention can be formed from an elastomeric polymeric material filled with an electrically conductive particulate filler. The elastomeric polymer can be a silicone, urethane or fluorosilicone, for instance. The conductive particulate filler is typically conductive metal particles, either in the micron or sub-micron range, such as conductive particles of copper, silver, nickel, aluminum, tin, or alloys thereof.

The gasket can be formed and shaped into sheets, tapes or tubes of selected dimensions for use in particular applications, typically between adjacent metal surfaces requiring both EMI shielding and corrosion resistance. Preferably, the adjacent surfaces are aluminum surfaces located on the exterior of an aircraft.

Projections are formed on one or more surfaces of the gasket material using known techniques, such as by compression molding or injection molding. The projections serve both to increase the contact surfaces available for improved electrical contact between the gasket surface and the adjacent structure to be sealed, and to reduce the overall surface area of the gasket for improved pliability.

A gel coating is applied to the surface of the gasket, filling the spaces between the projections, prior to placing the gasket between the adjacent surfaces. The gel can be a silicone polymer, such as a polysiloxane or a polyorganosiloxane, a polyurethane, acrylic, polyurea, fluoropolymer, chlorosulfonate, polybutadiene, butyl, neoprene, nitrite, polyisoprene, and buna-N, copolymers such as ethylene-propylene (EPR), styrene-isoprene-styrene (SIS), styrene-butadiene-styrene (SBS), ethylene-propylene-diene monomer (EPDM), nitrile-butadiene (NBR), styrene-ethylene-butadiene (SEB), and styrene-butadiene (SBR), and blends thereof such as ethylene or propylene-EPDM, EPR, or NBR. Suitable thermal gels include the THERM-A-GAP™ gel products, which are highly conformable, pre-cured, single-component compounds requiring only a relatively small compression force.

The gaskets of the invention can be formed into pre-defined shapes suitable for particular and specific applications. Alternatively, the gaskets can be formed into larger sheets, rolls, rods, etc. and cut to size by the end user to suit a particular application.

BRIEF DESCRIPTION OF THE DRAWINGS

The invention is illustrated by representative embodiments shown in the accompanying figures in which like reference numbers indicate similar elements.

FIG. 3 is a perspective view of an alternative embodiment of the invention depicting a ribbed tubular structure.

FIG. 4 is a cross sectional view of the ribbed tubular structure of FIG. 3 depicting the application of a gel to the spaces formed between the ribs of the structure.

Figure 1:
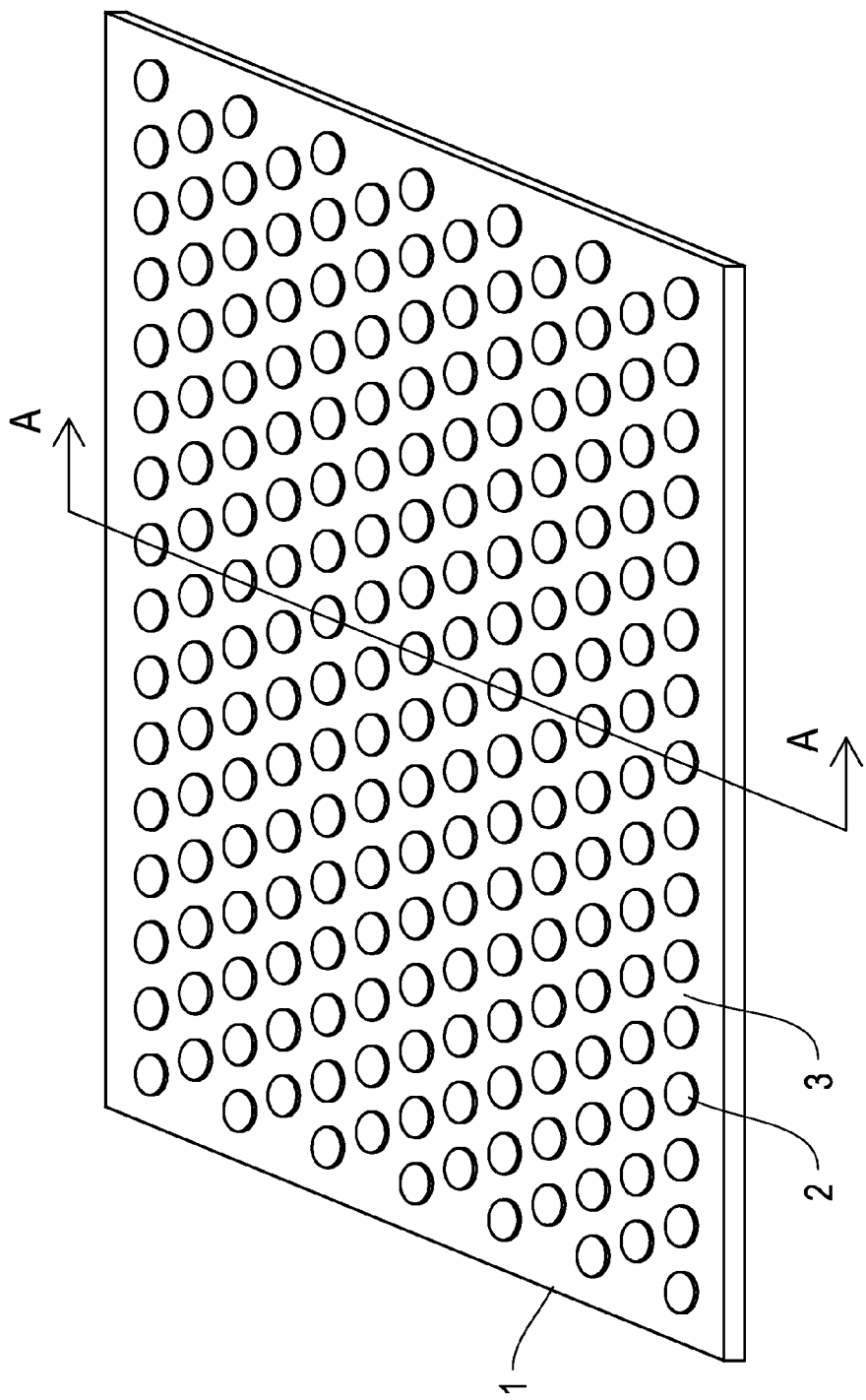
FIG. 1 is a perspective view of a textured gasket sheet showing surface projections in the form of miniature pedestals representing one embodiment of the invention.

It will be appreciated that elements in the figures are illustrated for simplicity and clarity, and have not necessarily been drawn to scale. For example, the dimensions of some of the elements in the figures may be exaggerated relative to other elements to help improve the understanding of the embodiments of the present invention. Certain terminology may be employed in the description to follow for convenience rather than for any limiting purpose.

DETAILED DESCRIPTION OF THE INVENTION

The invention provides an EMI gasket having both enhanced resistance to corrosion and a reduction in the compressive forces required to form a seal between adjacent surfaces in circumstances where both sealing and EMI shielding are required. The adjacent surfaces of the invention are typically metal surfaces exposed to corrosive and environmentally challenging conditions, such as external aluminum aircraft surfaces.

The invention includes an electrically conductive elastomeric polymer with at least one surface, and preferably both surfaces, having a plurality of projections extending outwardly from the surface, and a gel coating applied to the areas or spaces between the projections. Electrical contact between the seal and adjacent surfaces to be shielded is primarily made by the projections contacting the surfaces. The gel coating can be applied to the surface of the gasket, filling the spaces between the projections, prior to placing the gasket between adjacent surfaces to be sealed and shielded from EMI radiation. Preferably, the adjacent surfaces are adjacent metal surfaces such as aluminum surfaces.

As used herein, the term "EMI" includes, and is interchangeable with, electromagnetic interference, electromagnetic compatibility (EMC), electrical conduction and/or grounding, corona shielding, radio frequency interference (RFI) shielding, and anti-static, i.e., electro-static discharge (ESD) protection.

The term "projections" as used in connection with the gaskets of this invention include, inter alia, various shapes and sizes of outwardly (with reference to the gasket surface) extending shapes in minature, including without limitation, castellations of various shapes, columns, pedestals, pillars, ribs, etc. The projections are formed on one (or both) surfaces of the gasket and are spaced apart from each other forming "valleys" (seen in vertical cross-section) there between. In horizontal cross-section, the projections can be circular, square oblong, hexagonal, rectangular, or any other convenient shape.

The terms "gel" or "gel polymer" as used herein generally have their conventional meaning of a fluid-extended polymer system which may include a continuous polymeric phase or network, which may be chemically, e.g., ionically or covalently, or physically cross-linked, and an oil, such as a silicone or other oil, a plasticizer, unreacted monomer, or other fluid extender which swells or otherwise fills the interstices of the network. The cross-linking density of such network and the proportion of the extender can be controlled to tailor the modulus, i.e., softness, and other properties of the gel.

The gasket can be formed from the elastomeric polymer using conventional plastic molding techniques, such as compression molding or injection molding. The projections can be formed in the polymer as part of the molding process. Alternatively, the projections can be formed in the polymer using a mechanical device such as a mechanical roller or press to form a textured surface. The projections can be formed on one, or preferably both, surfaces of the gasket.

Elastomeric polymers suitable for forming the body of the gasket include polyethylene, polypropylene, polypropylene-EPDM blends, butadiene, styrene-butadiene, nitrile rubber, chlorosulfonate, neoprene, urethane, silicone, fluorosilicone, or a copolymer, blend or combination thereof.

The elastomeric polymer can be filled with an electrically conductive particulate filler to render the polymer electrically conductive and suitable for forming an EMI gasket. Suitable electrically conductive fillers include, by way of example, carbon, graphite and conductive metals such as copper, nickel, silver, aluminum, tin or alloys thereof. The conductive filler can be present in amounts of from about 20% to about 80% by total weight of the filled polymer. The conductive filler can have any shape and is preferably sized in the micron or sub-micron range. Suitable shapes include micron sized spheres, flakes and fibers.

The gasket can be prepared by molding the filled elastomer into a convenient shape suitable for a particular application using conventional molding processes, such as injection molding or compression molding. Typical shapes include, by way of example, sheets, tapes, tubes, rods, etc. Alternatively, the filled elastomer can be formed into a larger sheet, for instance, and customized for a particular application by cutting the gasket to the desired size and shape.

A gel polymer is applied to the gasket surface prior to installing the gasket at the site where sealing is desired. The gel has low hardness thereby permitting the use of lower deflection forces for installing the gasket and sealing the part. In addition, the gel serves to prevent galvanic corrosion due to the electrical contact made between the gasket and the adjacent metal surfaces to be sealed. Consequently, the gel should be non-electrically conductive.

Typical gel materials include non-conductive polymers such as silicones, i.e., polysiloxanes, such as polyorganosiloxane, as well as gels based on other polymers, which may be thermoplastic or thermosetting, such as polyurethanes, polyureas, fluoropolymers, chlorosulfonates, polybutadienes, acrylics, butyls, neoprenes, nitrites, polyisoprenes, and buna-N, copolymers such as ethylene-propylene (EPR), styrene-isoprene-styrene (SIS), styrene-butadiene-styrene (SBS), ethylene-propylene-diene monomer (EPDM), nitrile-butadiene (NBR), styrene-ethylene-butadiene (SEB), and styrene-butadiene (SBR), and blends thereof such as ethylene or propylene-EPDM, EPR, or NBR.

The projections on the gasket surface serve to establish the primary point of electrical contact between the gasket and the adjacent, usually metallic, surfaces. In addition, the reduced surface area of the gasket due to its textured surface advantageously results in a reduction in the deflection forces needed to compress the gasket and form a seal. Although the textured surface of the gasket offers the advantage of reduced deflection forces, the electrical contact between the gasket projections and adjacent metal surfaces can result in galvanic corrosion formed at the interface of the gasket and the adjoining metal surfaces. These corrosive forces can be alleviated by the application of a gel polymer to the gasket surface. The gel polymer serves to encase the projected sections of the gasket and isolate these sections from corrosive environmental conditions resulting from, for instance, exposure to salt water, high humidity, hydrocarbons, and other harsh environmental conditions. The gel also increases the overall pliability of the gasket, thereby lowering the deflection forces required to form a seal.

A flat or planar gasket configuration is shown in perspective in FIG. 1. The gasket 1 has raised pedestals 2 and "valleys" 3. The gel can be applied to the spaces or "valleys" between the pedestals prior to placing the gasket between the adjacent surfaces to be sealed. The flat or planar gasket can be a sheet with projections on one or both surfaces thereof. Alternatively, the flat or planar gasket can be a tape, such as a pliable tape, formed from a conformable acrylic polymer embossed with rectangular projections on one surface with an adhesive on the opposed surface.

Figure 2:
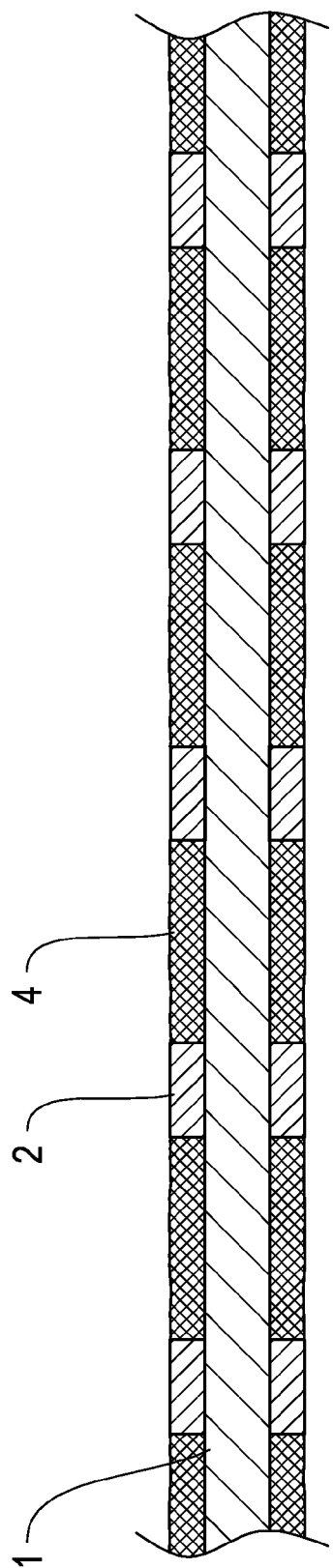
FIG. 2 is a cross sectional view of the textured gasket of FIG. 1 depicting the application of a gel to the interstices or spaces formed between surface projections.

A cross-section of the gasket taken through section A-A is shown in FIG. 2. Gasket 1 has projections 2 in the form of miniature pedestals on both opposed gasket surfaces. The spaces between the projections are filled with gel polymer 4. The gel polymer is applied prior to placing the gasket between adjacent surfaces and forming a seal.

A rod shaped gasket is shown in perspective in FIG. 3. Gasket 5 has rib sections 6 formed on the surface of the gasket. The gasket can be cut to size depending on the requirements of the particular sealing application.

FIG. 4 is a cross section of the gasket of FIG. 4 taken along section B-B. Gasket 5, which is hollow, has ribs 6 formed on the outer surface thereof. A polymer gel 7 is applied to the spaces between ribs 6 prior to installation of the gasket into a space for sealing.

The gaskets of the invention can be used in a variety of applications and under a variety of environmental conditions. One particularly useful application is for avionics, on both military and civilian aircraft, and particularly for external aircraft seals used to bond exterior electrical and electronic components, such as antennas, lights and altimeters, etc., to the aircraft skin, to provide EMI shielding and sealing around such components.

Due to their high corrosion resistance, the gaskets of the invention can be used in applications other than aviation where a harsh operating environment and a flat gasket form fits the mechanical design of the particular application. The gaskets of the invention can be used on dissimilar metals or aluminum structures, such as external aircraft surfaces, where moisture can create problems due to the potential for galvanic corrosion may present a problem. The use of the gaskets of the invention also eliminates the requirement for using two seals, i.e. one sealing member for EMI protection, and a second sealing member for environmental (corrosion) protection.

As it is anticipated that certain changes may be made in the present invention without departing from the precepts herein involved, it is intended that all matter contained in the foregoing description shall be interpreted as illustrative and not in a limiting sense. All references cited herein are expressly incorporated herein by reference thereto in their entirety.

What is claimed is:

1. An electromagnetic interference (EMI) shielding gasket comprising:
   a gasket body formed from an electrically conductive elastomeric polymeric material, the body having at least one surface with a plurality of projections extending from said surface, said projections being spaced apart from each other defining a space there between; and
   an electrically nonconductive gel coating applied to at least a portion of the surface of the gasket body, the coating filling at least a portion of the space.

2. The gasket of claim 1 wherein:
   the body is generally planar, tubular, cylindrical, or otherwise elongated and extending lengthwise along a longitudinal axis; and
   the projections are configured as a series of ribs extending along the longitudinal axis.

3. The gasket of claim 1 wherein the body has a first surface and a second surface opposite the first surface, the projections extending from both the first and second surfaces and being configured as a pattern of embossments.

4. The gasket of claim 3 which is placed between two aluminum surfaces located on an aircraft.

5. The gasket of claim 1 wherein the electrically nonconductive elastomeric polymeric material is filled with an electrically conductive particulate filler.

6. The gasket of claim 5 wherein the electrically conductive particulate filler is a metal selected from the group consisting of a copper, nickel, silver, aluminum, tin, or an alloy thereof.

7. The gasket of claim 1 wherein the gel is selected from the group consisting of silicones, fluorosilicones, urethanes, and mixtures thereof.

8. The gasket of claim 1 which is in the form of a tape.

9. The gasket of claim 1 wherein the projections are in the shape of small pedestals surrounded by the gel coating.

10. The gasket of claim 1 wherein the gel is applied to the entire surface of the gasket body.

* * * * *